INVENTORS
BENJAMIN M. RABINOVICI &
RAGNAR STALEMARK
BY
Eugene M. Whitacre
ATTORNEY July 20, 1965 B. M. RABINOVICI ETAL 3,196,370

SEMICONDUCTOR MODULATORS

Filed May 5, 1961 3 Sheets-Sheet 2

INVENTORS
BEJAMIN M. RABINOVICI &
BY RAGNAR STALEMARK
Eugene M. Whitacre
ATTORNEY INVENTORS
BENJAMIN M. RABINOVICI &
RAGNAR STALEMARK
BY Eugene M. Whitacre
ATTORNEY United States Patent Office 3,196,370
Patented July 20, 1965

3,196,370
SEMICONDUCTOR MODULATORS

Benjamin M. Rabinovici, Rego Park, and Ragnar F. V. Stalemark, Armonk, N.Y., assignors to Radio Corporation of America, a corporation of Delaware Filed May 5, 1961, Ser. No. 108,034
6 Claims. (Cl. 332—44)

This invention relates to semiconductor modulators and more particularly to balanced modulators employing negative resistance diodes.

Balanced modulators are utilized in suppressed carrier communication systems to provide output waves which include modulation-bearing sidebands but which do not include waves at the carrier frequency. Such modulators avoid the necessity of providing complex and expensive filter circuits designed to remove carrier frequency waves before further processing.

Heretofore balanced modulators ordinarily required the use of a pair of nonlinear impedance devices to suppress the carrier waves. The nonlinear devices had to be closely matched to exhibit substantially identical impedance characteristics in order to provide the necessary symmetry or balance for such suppression. Devices such as passive semiconductor diodes and active elements such as vacuum tubes or transistors have frequently been utilized as the nonlinear impedances in such balanced modulators. However, when diodes are utilized, an insertion loss of from eight to ten decibels is introduced into the modulator circuit because the positive resistances of the diodes dissipate a portion of the signal power applied thereto. This results in a loss that is excessive for many applications. When transistors or vacuum tubes are utilized, a modulation gain is provided but the circuitry is more complex and, in addition, compensating circuits may be required in order to minimize operating point variations due to temperature changes, bias supply fluctuations and the like. If such variations occur, the modulators tend to become unbalanced and fail to provide the desired carrier suppression.

Accordingly it is an object of this invention to provide an improved semiconductor balanced modulator which is simple in construction and stable in operation.

It is another object of this invention to provide an improved balanced modulator which requires only a single nonlinear impedance device.

It is another object of this invention to provide an improved balanced modulator employing a single negative resistance diode which provides a modulation gain.

A balanced modulator in accordance with the invention includes a negative resistance diode having a current-voltage characteristic exhibiting first and second positive conductance portions separated by a negative conductance portion with the region at the transition from positive to negative conductance portions being substantially parabolic in shape. One type of negative resistance diode which exhibits such a nonlinear characteristic is known as a tunnel diode. A negative resistance diode of this type is biased for stable operation at the peak point of the parabolic region of its characteristic by a suitable biasing circuit. A source of oscillatory waves of a carrier frequency and a source of signal (modulating) waves are coupled in series with the diode. The applied carrier and signal waves are mixed in the nonlinear resistance of the diode and the resultant output waves include modulated sum and difference frequency waves (i.e. upper and lower sidebands). Operation in the parabolic region of the diode characteristic substantially prevents both signal and carrier frequency wave components from appearing in the output, thereby providing balanced modulation. Furthermore modulation gain is produced because a portion of the operating cycle occurs in the negative resistance region of the diode where amplification as well as mixing is provided.

In accordance with a feature of the invention, a pair of matched negative resistance diodes are both biased in the parabolic region of their current-voltage characteristic and are coupled to carrier and signal wave sources to provide a double-balanced or ring-type modulator.

Accordingly, it is a further object of this invention to provide an improved double-balanced modulator utilizing a pair of negative resistance diodes.

The novel features which are considered characteristic of this invention are set forth with particularity in the appended claims. The invention itself, however, both as to its organization and method of operation as well as additional objects and advantages thereof will best be understood from the following description when read in conjunction with the accompanying drawing in which:

Figures 1, 2:
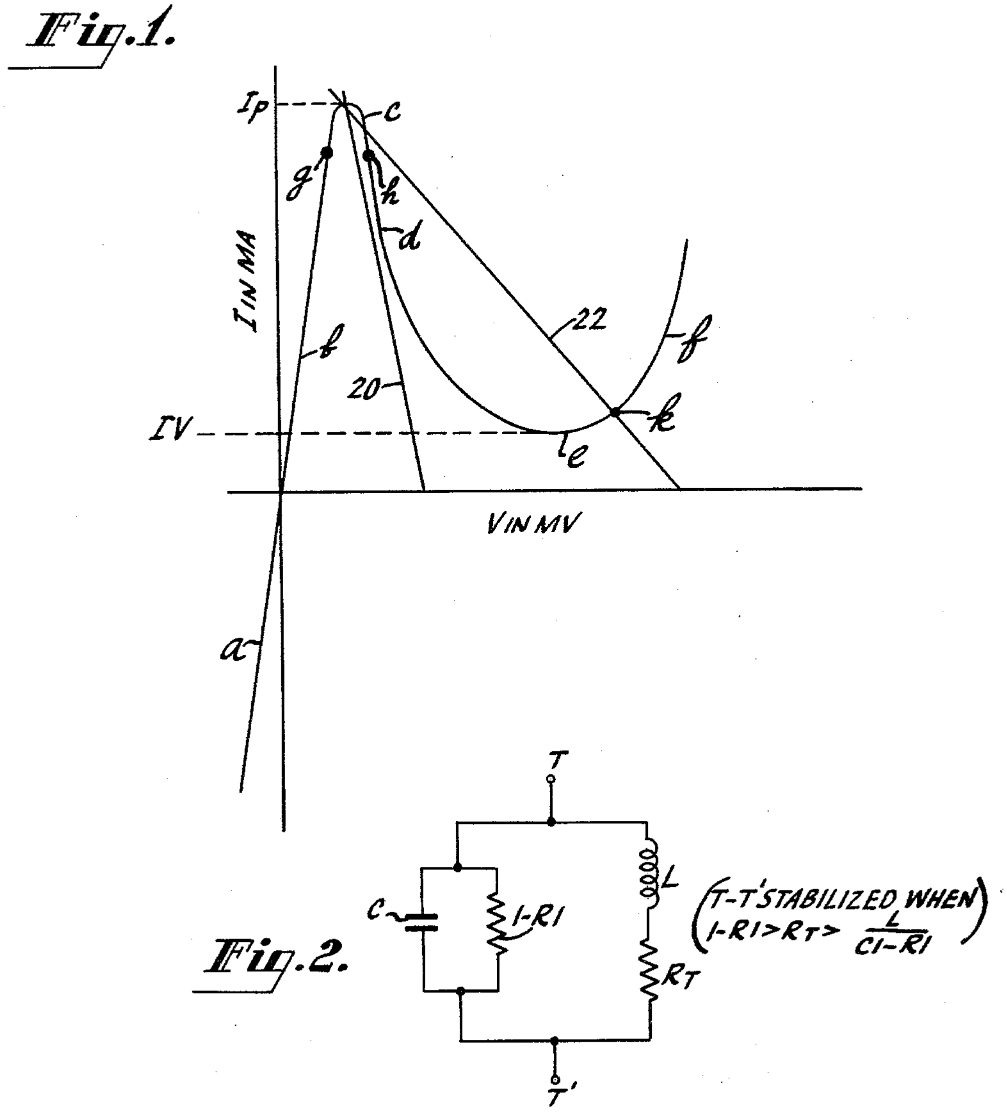
FIGURE 1 is a graph illustrating the current voltage characteristic of a negative resistance diode of the type employed in the invention.
FIGURE 2 is an equivalent circuit of the negative resistance diode employed in the invention.

Reference is now made to FIGURE 1, which is a graph illustrating the current-voltage characteristic of a negative resistance diode suitable for use in circuits embodying the invention. Such a diode has been described by H. S. Sommers in the article "Tunnel Diodes as High Frequency Devices" at page 1201 in the July 1959 issue of the Proceedings of the I.R.E.

For voltages in the back or reverse direction, the reverse current of the diode increases as a function of voltage as shown by the region *a* in FIGURE 1. For small values of voltages in the forward direction, the initial forward current increases as a function of voltage as is shown by the region *b*. As the forward voltage is increased further, the forward current first reaches a maximum or peak value $I_p$ in the region *c* and then begins to decrease. The decrease in forward current continues throughout the region *d*, which is the negative resistance region, until the current reaches a minimum value $I_v$ in the region *e*. Thereupon the characteristic turns into the usual forward characteristic of a semiconductor diode as shown by the region *f*. Thus a tunnel diode exhibits the normal N-shaped characteristic of a voltage-controlled negative resistance.

The region *c* between the points $g$–$I_p$–$h$ is substantially parabolic in shape. When the diode is biased at the current peak point $I_p$ in this region, it exhibits the property of a full wave rectifier. Consequently an alternating wave of a fundamental frequency and of a limited amplitude applied in series to the diode when so biased will produce a resultant diode current having a frequency which is double that of the fundamental. Thus the fundamental frequency of an applied alternating wave is effectively suppressed in the diode when so operated.

To function as a balanced modulator, the diode is stably biased to operate substantially about the peak $I_p$. This requires a biasing circuit which exhibits a load line such as 20 as shown in FIGURE 1. The load line 20 is characterized by the fact that it intersects the current-voltage characteristic of the diode at one point only. To obtain the load line 20, it is necessary that the resistance of the biasing circuit be less than the absolute value of minimum negative resistance of the diode. If the biasing circuit has a resistance which is greater than the negative resistance of the diode, a load line such as 22 is obtained which intersects the diode current-voltage characteristic at three points. Under this condition, the diode is not stably biased to operate in the negative resistance region $d$ during even a small part of the operating cycle of the circuit. This lack of stability is because an increase in current through the diode when operating near the peak point $I_p$ causes the diode to switch rapidly through the negative resistance region to a stable point $k$ represented by the intersection of the load line 22 with the positive resistance region $f$ of the diode characteristic curve.

In addition to the criterion for biasing the diode to obtain a load line having a single intersection with the diode characteristic, a further condition must be fulfilled in order to prevent the diode from oscillating when it is operated in the negative resistance region during a portion of the operating cycle. In FIGURE 2 is shown the equivalent circuit of an encapsulated tunnel diode biased to exhibit a negative resistance. Here $|-R|$ is the absolute value of minimum negative resistance of the diode. C is the total effective capacitance across the diode and includes the junction capacitance of the diode itself. L is the total effective inductance in series with the diode and includes the inductance of the diode package as well as the biasing circuit lead inductance. $R_T$ is the total effective positive resistance in series with the diode and includes the biasing circuit resistance mentioned previously as well as the very small dissipative resistance of the diode itself.

In order to operate in the negative resistance region for even a portion of the operating cycle without oscillations in the diode, the following inequality must be fulfilled:

$$\frac{L}{C|-R|}<R_T \tag{1}$$

A derivation of the above inequality is provided in the May 1960 Bell System Technical Journal article beginning on page 477. The criterion discussed previously for a single valued intersection with the diode characteristic of the load line due to the series resistance $R_T$ may be expressed by the inequality:

$$R_T<|-R| \tag{2}$$

Combining inequalities (1) and (2), the stability requirements for a tunnel diode to be operated as a balanced modulator may be represented as:

$$\frac{L}{C|-R|}<R_T<|-R| \tag{3}$$

Figure 3:
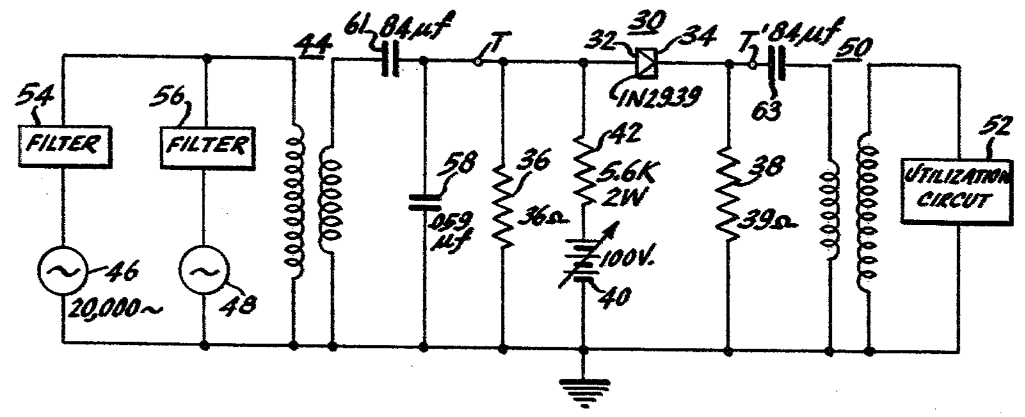
FIGURE 3 is a schematic circuit diagram, partly in block form, of a balanced modulator embodying the invention.

Referring to FIGURE 3 a balanced modulator in accordance with the invention includes a negative resistance diode 30 having an anode 32 and a cathode 34. To operate as a balanced modulator the diode 30 is biased substantially at the current peak point $I_p$ in the region $c$ of the diode characteristic. This is accomplished by connecting a resistor 36 between the anode 32 of the diode 30 and a point of reference potential in the circuit or ground, and a second resistor 38 between the cathode 34 of the diode 30 and ground. A biasing source, comprising the series combination of a variable power supply, represented in FIGURE 3 as a variable battery 40, and a resistor 42 is connected between the anode 32 of the diode 30 and ground to provide energizing potential to forward bias the diode 30. The resistor 42 is selected to have a resistance magnitude substantially higher than the resistor 36 so that the parallel combination thereof substantially equals the resistance magnitude of the resistor 36. Furthermore the series combination of the resistors 36 and 38 across the diode 30 are selected to have a combined resistance value less than the absolute value of minimum negative resistance of the diode $$(\text{i.e. } R_{36}+R_{38}<|-R|)$$

to fulfill the condition imposed by the inequality (2). To reduce the effective inductance appearing in series with the diode 30 and comply with the inequality (1), the resistors 36 and 38 are placed physically near the diode 30 terminals and the lead lengths thereto are made short. Thus the circuit will be stabilized between the terminals $T$–$T^1$ under the above conditions.

An input transformer 44 is provided to apply waves of a carrier frequency ($f_c$) from a source 46 and waves of a modulating frequency ($f_m$) from a signal source 48 to the negative resistance diode 30. An output transformer 50 is provided to couple the output waves produced by the interaction of the carrier and signal waves in the nonlinear resistance of the diode 30 to an output circuit 52. The carrier wave and signal sources 46 and 48 are coupled in parallel, through a pair of filters 54 and 56 respectively, across the primary winding of the transformer 44. The filters 54 and 56 prevent currents at the carrier wave frequency ($f_c$) and modulating wave frequency ($f_m$) from circulating through the signal source 48 and carrier wave source 46 respectively. The turns ratio of the primary and secondary of the transformer 44, in conjunction with a capacitor 58 which is shunted across the secondary of the transformer 44, are selected to provide an impedance match between the resistor 36 and the combined output resistances of the carrier and modulating wave circuits. Similarly the turns ratio of the primary and secondary of the output transformer 50 is selected to provide an impedance match between the resistor 38 and the output circuit 52, which may for example comprise a filter designed to pass upper and lower sideband frequencies but to remove the double frequency component of the carrier wave ($2f_c$) from the output waves of the diode 30. A pair of D.C. blocking capacitors 61 and 63, which exhibit a minimal reactance at input and output frequencies, connect the diode 30 between the secondary winding of the input transformer 44 and the primary winding of the output transformer 50. The capacitors 61 and 63 prevent biasing current from being shunted around the diode 30 through the transformers 44 and 50.

In operation, alternating waves of frequencies $f_c$ and $f_m$ from the carrier wave and signal sources respectively are applied in series to the diode 30. The diode characteristic throughout the transition region $c$ between the points $g$–$I_p$–$h$, as shown in FIGURE 1, is nearly parabolic in shape and with a biasing point selected substantially at the current peak point $I_p$ may be approximated by a parabola of the form:

$$i=-kv^2 \tag{4}$$

where $i$ and $v$ represent current and voltage deviations from the biasing point $I_p$ and $k$ is a constant depending on the particular diode used.

Figure 4:
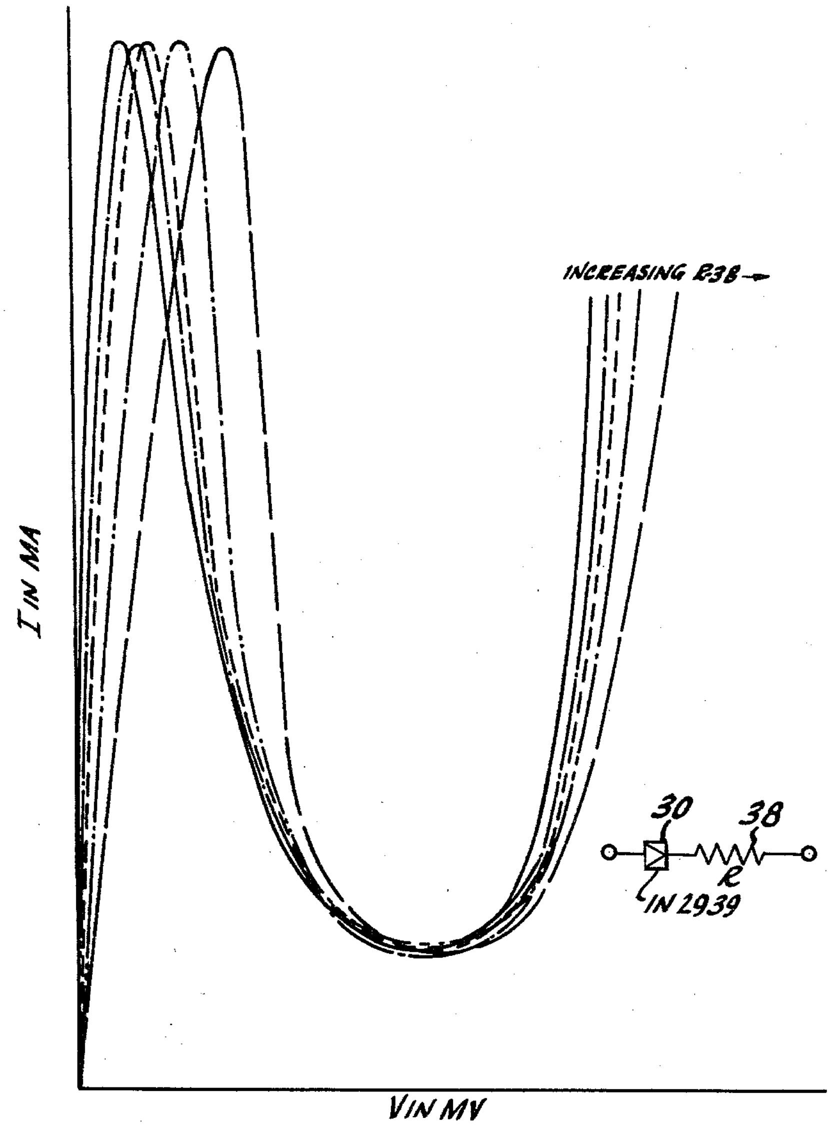
FIGURE 4 is a graph illustrating the manner in which the current-voltage characteristic of the negative resistance diode may be shaped to provide a more nearly parabolic characteristic.

From equation 4, it is seen that the series application of sinusoidal waves of frequencies ($f_c$) and ($f_m$) to the diode 30 will produce a varying current in the diode 30 which contains components including sum and difference frequencies ($f_c \pm f_m$) as well as components at twice the frequencies of the applied waves ($2f_c$ and $2f_m$). However no output waves at the carrier or signal frequencies will be produced. Therefore the diode 30 will function as a balanced modulator with the extent of carrier suppression being dependent on how closely the transition region $c$ is symmetrical about the biasing point $I_p$. As shown in FIGURE 4, the current-voltage characteristic of the diode 30 may be varied by changing the value of the resistor 38 to obtain a composite characteristic which is more nearly parabolic in shape. However, the value of the resistors 36 and 38 in series combination must remain within limits imposed by the inequality (2).

The amplitude of the carrier waves is selected to limit the operation of the diode 30 to substantially within the parabolic region c of FIGURE 1. The diode 30 when so operated is driven into its negative resistance region for approximately half of its operating cycle. In the negative resistance region amplification as well as mixing occurs. Thus a large percentage of the losses introduced while operating in the positive resistance region of the diode 30 is overcome and the modulator exhibits substantially no modulation losses.

Thus in accordance with the invention a balanced modulator is provided which requires only a single negative resistance tunnel diode as the nonlinear element thereof. The resistance exhibited by the diode at the biasing point is extremely high (substantially zero conductance) and presents little loading effects on the carrier and signal sources. This makes the negative resistance modulator particularly suitable for low signal level applications and makes it possible to feed a large number of such modulators from a single carrier wave source. Because only one active element is utilized, there is no need to provide closely matched nonlinear devices as was heretofore necessary. Furthermore, in addition to the relative simplicity and stability of the balanced modulator, a modulation gain is provided due to operating in negative resistance region of the diode for a portion of the operating cycle.

Representative values of circuit components are shown in FIGURE 3. With the values shown thereon, a balanced modulator constructed in accordance with the invention provided a carrier suppression of over 30 decibels and had a flat frequency response over the audio range.

Figure 5:
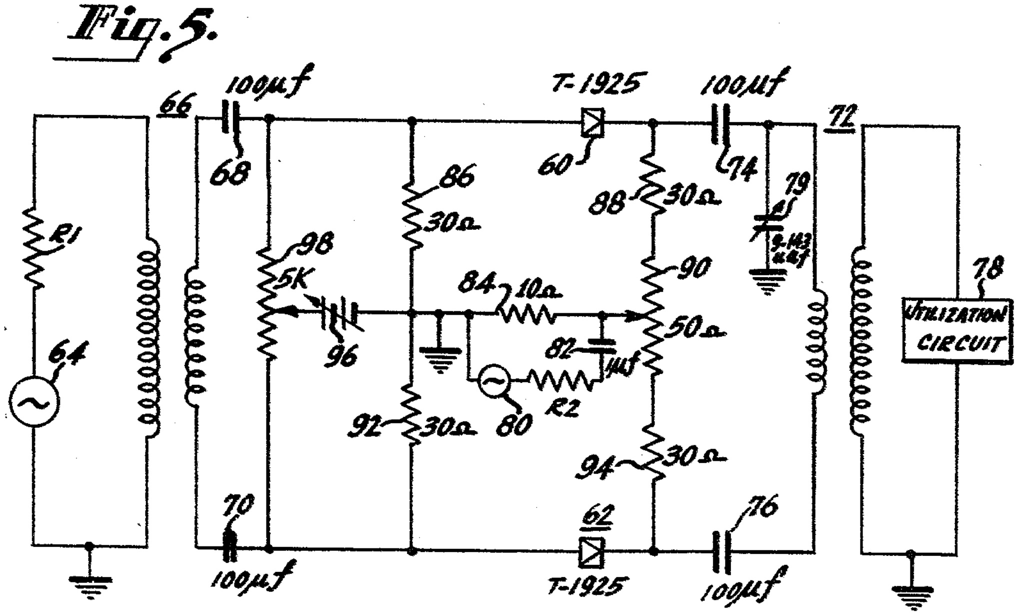
FIGURE 5 is a schematic circuit diagram, partly in block form of a double balanced modulator embodying the invention.

Referring to FIGURE 5, a double-balanced modulator in accordance with the invention includes a pair of substantially matched negative resistance diodes 60 and 62. Modulating waves from a signal source 64, having an internal resistance $R_1$, are coupled to the diodes 60 and 62 by means of an input transformer 66. The signal source is coupled across the primary winding of the transformer 66 while the anodes of the diodes 60 and 62 are coupled to the secondary winding terminals through a pair of capacitors 68 and 70. The cathodes of the diodes 60 and 62 are coupled to the terminals of the primary winding of an output transformer 72 through a pair of capacitors 74 and 76, while a utilization circuit 78, similar to that of circuit 52 in FIGURE 3, is coupled across the secondary winding thereof. A variable capacitor 79 is connected from ground to the cathode of the diode 60 through the capacitor 74 to tune the primary circuit output transformer 72 and help provide impedance matching. A source of carrier waves 80, having an internal resistance $R_2$, is coupled to the diodes 60 and 62 through the D.C. biasing circuit of the diodes 60 and 62. A capacitor 82 is connected in series with the source 80 to prevent direct current from flowing therethrough and a resistor 84 of low magnitude is shunted across the capacitor 82 and carrier wave source 80 to reduce the effective resistance of the carrier wave source 80.

The total effective bias stabilizing resistance for the diode 60 includes the series combination of a pair of resistors 86 and 88, a portion of the resistance exhibited by a potentiometer 90 as well as the carrier wave source shunting resistor 84. The resistor 86 is connected between the anode of the diode 60 and ground, while the resistor 88 is connected between the cathode of the diode 60 and one terminal of the potentiometer 90. The adjustable arm of the potentiometer 90 is grounded through the carrier wave source shunting resistor 84. The diode 62 is biased the same as the diode 60. The total effective bias stabilizing resistance for the diode 62 includes the series combination of a pair of resistors 92 and 94 as well as the potentiometer 90 and the carrier wave source shunting resistor 84. The potentiometer 90 permits adjustment of the current-voltage characteristics of the diodes 60 and 62 to prevent mismatches therebetween.

A bias energizing source for the diodes 60 and 62 is provided by a variable power supply, represented in FIGURE 5 as a variable battery 96 and a potentiometer 98. The fixed terminals of the potentiometer 98 are connected directly to the anodes of the diodes 60 and 62 while the adjustable arm of the potentiometer 98 is connected to the positive terminal of the battery 96, the negative terminal of which is grounded. The capacitors 68 and 70 as well as the capacitors 74 and 76 function as D.C. blocking capacitors to prevent bias current from being shunted through the transformers 66 and 72. The turns ratios of the input and output transformers 66 and 72 are selected to provide impedance matching similar to that described previously for the circuit of FIGURE 3.

In operation, the adjustable arm of the potentiometer 98 and the variable potential source 96 are adjusted to bias both the diodes 60 and 62 at substantially the current peak points $I_p$ of their current voltage characteristic. The voltage amplitude of the carrier wave source 80 is selected to limit operation of the diodes 60 and 62 to substantially the parabolic region about the current peak point $I_p$. The diodes 60 and 62 mix the applied carrier frequency waves ($f_c$) and modulating frequency waves ($f_m$) to produce sum and difference frequency component output waves ($f_c \pm f_m$) but cancel substantially all even order harmonics of the carrier and modulating waves as well as the fundamental frequencies thereof. Thus spurious frequency responses are substantially reduced and the double balanced negative resistance modulator functions similarly to a conventional ring-type modulator without the necessity of providing four matched nonlinear devices. Furthermore the substantial modulation losses inherent in the conventional ring-type modulator is avoided in applicant's tunnel diode double-balanced modulator due to operating in the negative resistance regions of the diodes 60 and 62 during a portion of the operating cycle.

What is claimed is:

1. An electrical circuit comprising in combination a voltage-controlled negative resistance diode having an N-shaped current-voltage characteristic including first and second positive conductance regions separated by a negative conductance region, means for stably biasing said diode at a point of substantially zero dynamic conductance in said current-voltage characteristic, means for applying electrical waves of first and second frequencies to said diode and output circuit means coupled to said diode to derive intermodulation products produced by the interaction of said first and second frequency waves in the non-linear resistance of said diode.

2. An electrical circuit comprising in combination a negative resistance diode having a nonlinear current-voltage characteristic including first and second positive conductance regions separated by a negative conductance region and exhibiting a current peak between said first positive conductance region and said negative conductance region, means for stably biasing said diode substantially at said current peak, means for applying electrical waves of first and second frequencies in series to said diode, and output circuit means coupled to said diode to derive sum and difference frequency waves produced by the interaction of said first and second frequency waves in the nonlinear resistance of said diode.

3. A balanced modulator comprising in combination a voltage-controlled negative-resistance diode having an N-shaped current-voltage characteristics including first and second positive conductance regions separated by a negative conductance region and having a nonlinear transition region between said first positive conductance region and said negative conductance region which is substantially symmetrical about the peak point of said transition region, means for stably biasing said diode substantially at the peak point of said transition region, means for applying waves of a carrier frequency and a modulating frequency to said diode, said carrier frequency waves having a voltage amplitude which limits the excursions of current through said diode to substantially said transition region to suppress said carrier waves, and output circuit means coupled to said diode for deriving output waves including the upper and lower sidebands produced by the interaction of said carrier and modulating waves in said transition region.

4. An electrical circuit comprising in combination first and second negative resistance diodes each having a current-voltage characteristic including first and second positive conductance regions separated by a negative conductance region and exhibiting a current peak in the transition region between said first positive conductance region and said negative conductance region, means for monostably biasing each of said diodes substantially at said current peak, and means electrically coupled to said negative resistance diodes for applying signal waves of a first and a second different frequencies.

5. A balanced modulator comprising in combination a negative resistance diode having a anode and a cathode, said diode exhibiting a current-voltage characteristic in the forward direction which includes first and second positive conductance regions separated by a negative conductance region and having a current peak in the transition region between said first positive conductance region and said negative conductance region, said transition region being substantially parabolic in shape, biasing circuit means including first and second resistors connected in series between the anode and cathode of said diode and having a total resistance less than the absolute value of minimum negative resistance of said diode, the junction of said first and second resistors being connected to a point of reference in the circuit, means providing a source of energizing potential exhibiting a resistance substantially higher than said first resistor connected between the anode of said diode and said reference point to provide energizing potential to forward bias said diode to substantially said current peak, means providing a source of carrier waves and a source of modulating waves connected between the anode of said diode and said reference point, said carrier waves having a voltage amplitude which limits the excursions of current through said diode to said transition region to suppress said carrier waves, and output circuit means connected between cathode of said diode and said reference point to derive output waves of a different frequency than said carrier and modulating waves produced by the interaction of said carrier and modulating waves in the nonlinear transition region of said diode.

6. A double balanced modulator comprising, first and second negative resistance diodes each having a pair of electrodes, and each having a current-voltage characteristic including a first and second positive conductance region separated by a negative conductance region, and exhibiting a current peak in the transition region between said first positive conductance region and said negative conductance region; means for coupling modulating waves to one electrode of said diodes, said means comprising a transformer having its secondary winding coupled to said one electrode of said diodes; a utilization circuit inductively coupled to the other electrode of said diodes; means for monostably biasing each of said diodes substantially at said current peak, said biasing means including a source of direct current voltage and a potentiometer, said potentiometer having two fixed terminals and a variable arm, said fixed terminals and said variable arm being connected respectively to the electrodes of said diodes, said arm being connected to said voltage source to provide a variable biasing voltage for said diodes; and means for coupling signal carrier waves to said other electrode of said diodes, so that said diodes mix said carrier frequency waves and said modulating frequency waves to produce sum and difference frequency component output waves and to cancel substantially the fundamental frequencies and all the even order harmonics of said carrier wave and said modulating wave.

References Cited by the Examiner

UNITED STATES PATENTS

| | | | |
|---|---|---|---|
| 2,843,826 | 7/58 | Moore et al. | 332—44 |
| 2,958,046 | 10/60 | Watters | 307—88.5 |
| 3,111,592 | 11/63 | Watters | 307—88.5 |

FOREIGN PATENTS

IBM Tech. Disclosure Bulletin (I), vol. 3, No. 10, page 74, March 1961.

IBM Tech. Disclosure Bulletin (II), vol. 3, No. 9, page 32, February 1961.

ROY LAKE, *Primary Examiner.*

ROBERT H. ROSE, *Examiner.*